United States Patent
Okuda

(10) Patent No.: US 10,644,483 B2
(45) Date of Patent: May 5, 2020

(54) METHOD OF INSPECTING SPARK PLUG AND METHOD OF MANUFACTURING SPARK PLUG

(71) Applicant: NGK SPARK PLUG CO., LTD., Nagoya-shi, Aichi (JP)

(72) Inventor: Masafumi Okuda, Nagoya (JP)

(73) Assignee: NGK SPARK PLUG CO., LTD., Nagoya-shi (JP)

( * ) Notice: Subject to any disclaimer, the term of this patent is extended or adjusted under 35 U.S.C. 154(b) by 0 days.

(21) Appl. No.: 16/520,429

(22) Filed: Jul. 24, 2019

(65) Prior Publication Data

US 2020/0044421 A1 Feb. 6, 2020

(30) Foreign Application Priority Data

Aug. 6, 2018 (JP) ................................. 2018-147334

(51) Int. Cl.
| | |
|---|---|
| *H01T 13/60* | (2011.01) |
| *H01T 21/02* | (2006.01) |
| *G01N 27/20* | (2006.01) |
| *G01R 31/12* | (2020.01) |

(52) U.S. Cl.
CPC ........... *H01T 13/60* (2013.01); *G01N 27/205* (2013.01); *G01R 31/12* (2013.01); *H01T 21/02* (2013.01)

(58) Field of Classification Search
CPC ......... H01T 13/58; H01T 13/60; H01T 21/02; G01N 27/20–205; G01R 31/12–20
See application file for complete search history.

(56) References Cited

U.S. PATENT DOCUMENTS

| | | | | |
|---|---|---|---|---|
| 5,254,954 | A | * 10/1993 | Fujimoto | ................ H01T 13/60 324/393 |
| 6,909,286 | B2 | * 6/2005 | Hori | .................... G01N 27/205 324/401 |
| 2013/0337717 | A1 | * 12/2013 | Hirose | .................... H01T 13/60 445/3 |
| 2016/0223604 | A1 | * 8/2016 | Hirose | .................... H01T 13/60 |
| 2017/0025823 | A1 | | 1/2017 | Kimura et al. |

FOREIGN PATENT DOCUMENTS

| | | |
|---|---|---|
| JP | 2016-173958 A | 9/2016 |
| JP | 2017-27726 A | 2/2017 |

* cited by examiner

*Primary Examiner* — Mariceli Santiago
(74) *Attorney, Agent, or Firm* — Kusner & Jaffe

(57) ABSTRACT

A plurality of assemblies are prepared, and a predetermined voltage is applied to a center electrode of each of the plurality of assemblies. The voltage applied to each of the plurality of center electrodes is detected by respective voltage sensors, and a differentiated value is calculated by differentiating the applied voltage, detected by each voltage sensor, with respect to time. A judgment is made as to whether or not a differentiated value change state in which an absolute value of the differentiated value becomes equal to or greater than a predetermined threshold value occurs. A judgment is made as to whether or not the occurrence of the differentiated value change state is caused by the noise, according to the voltage applied, for a specific time from the occurrence of the differentiated value change state, to the center electrode where the differentiated value change state has occurred.

4 Claims, 5 Drawing Sheets

METHOD OF INSPECTING SPARK PLUG AND METHOD OF MANUFACTURING SPARK PLUG

BACKGROUND

The present invention relates to a method of inspecting a spark plug and a method of manufacturing the spark plug.

A related art spark plug normally has an insulator having an axial hole that extends along an axis, a center electrode accommodated in the axial hole of the insulator with a part of the center electrode being exposed from a top end side of the insulator, a metal shell provided on an outer periphery of the insulator so as to cover a periphery of at least a part of the insulator, and a ground electrode connected to a top end side of the metal shell and bent so as to form a spark discharge gap between the ground electrode and the center electrode. By applying a high voltage to the center electrode of the spark plug, a spark discharge occurs between a tip of the center electrode and the ground electrode.

In a case of this kind of spark plug, however, if a crack appears or exists at the insulator, a discharge (called a "through-discharge") occurs from the center electrode to the metal shell through its cracking portion of the insulator, and there is a risk that a normal discharge will not occur between the center electrode and the ground electrode. Therefore, in Japanese Unexamined Patent Application No. 2017-027726 (hereinafter is referred to as "JP2017-027726"), a method of inspecting such through-discharge is introduced as an inspection process into a manufacturing method of the spark plug.

As the inspection method disclosed in the JP2017-027726, an inspection high voltage is applied to the center electrode in a state in which the ground electrode is not bent yet, and a judgment is made as to whether or not there is a possibility that the through-discharge has occurred between the center electrode and the metal shell. This judgment is carried out by continuously detecting the voltage applied to the center electrode and comparing a differentiated value, which is obtained by differentiating this detected value of the applied voltage with respect to time, to a threshold value. Then, when an absolute value of the differentiated value is equal to or greater than the threshold value, it is judged that the through-discharge has occurred.

SUMMARY

Here, high performance or high efficiency is required of such inspection. As one solution, it is conceivable that a plurality of insulators are inspected at once using a plurality of inspection units. However, if the inspections are carried out by the plurality of inspection units, there is a risk that a voltage applied by one inspection unit will appear as a noise at another inspection unit. Then, if the noise is generated, the absolute value of the differentiated value becomes large, and this will pose a risk of wrongly judging the occurrence of the through-discharge although the through-discharge has not actually occurred.

The present invention was made in order to accomplish at least one of the above tasks. An object of the present invention is therefore to provide a method of inspecting a spark plug and a method of manufacturing the spark plug which are capable of increasing accuracy of the inspection when concurrently conducting the inspections of the plurality of insulators.

According to one aspect of the present invention, a method of inspecting a spark plug comprises: an inspection process of inspecting a defect of an insulator of the spark plug, the inspection process comprises: preparation step of preparing a plurality of assemblies, wherein each assembly has the insulator having an axial hole that extends along an axis, a center electrode accommodated in the axial hole of the insulator with a part of the center electrode being exposed from a top end side of the insulator, a metal shell provided on an outer periphery of the insulator so as to cover a periphery of at least a part of the insulator and a ground electrode connected to a top end side of the metal shell; voltage application step of applying a predetermined voltage to the center electrode of each of the plurality of assemblies prepared in the preparation step; detection step of detecting a voltage applied to each of the plurality of center electrodes by voltage sensors corresponding to the respective center electrodes at least during a time period during which the voltage application step is carried out; differentiation step of calculating a differentiated value by differentiating the applied voltage, detected by each of the plurality of voltage sensors during the detection step, with respect to time; differentiated value judgment step of judging whether or not a differentiated value change state in which an absolute value of any one differentiated value calculated in the differentiation step becomes equal to or greater than a predetermined threshold value occurs; and noise judgment step of judging, when the differentiated value change state is judged to have occurred by the differentiated value judgment step, whether or not the occurrence of the differentiated value change state is caused by noise, according to the voltage applied, for a specific time from the occurrence of the differentiated value change state, to the center electrode where the differentiated value change state has occurred.

According to the inspection method of the spark plug, first, the plurality of assemblies are prepared, and the predetermined voltage is applied to the center electrode of each of the plurality of assemblies. The voltage applied to each of the plurality of center electrodes is detected by the respective voltage sensors, and the differentiated value is calculated by differentiating the applied voltage, detected by each of the voltage sensors, with respect to time. In a case where the discharge does not occur at the assembly, since the applied voltage changes smoothly or gently, the absolute value of the differentiated value is small. However, in a case where the discharge has occurred at the assembly, since the voltage value (the applied voltage) rapidly changes, the absolute value of the differentiated value becomes large. Therefore, by judging whether or not the differentiated value change state in which the absolute value of the differentiated value becomes equal to or greater than the predetermined threshold value occurs, the judgment as to whether or not the through-discharge has occurred can be made.

This differentiated value change state could occur not only when the through-discharge occurs, but also when the noise is generated. Here, when the through-discharge has occurred, the applied voltage just after the occurrence of the through-discharge is substantially maintained at a voltage of the ground electrode, whereas when the noise is generated, the applied voltage just after the occurrence of the through-discharge returns to the voltage that is substantially same as or close to the voltage before the noise is generated. In the present invention, the inventor focused attention on this phenomenon, and according to the voltage applied, for the specific time (a predetermined time) from the occurrence of the differentiated value change state, to the center electrode where the differentiated value change state has occurred, the judgment is made as to whether or not the occurrence of the differentiated value change state is caused by the noise. With this judgment, it is possible to judge whether the occurrence of the differentiated value change state is caused by the noise or by the discharge. Hence, accuracy of the inspection when concurrently conducting the inspections of the plurality of insulators can be increased.

In the inspection process, an image of a top end side of each of the plurality of assemblies could be captured by imaging devices during the voltage application step. Also, in the inspection process, when judged that the occurrence of the differentiated value change state is not caused by the noise in the noise judgment step, according to the image obtained by the image-capture step, the judgment could be made as to whether or not the defect exists at the insulator of the assembly where the differentiated value change state has occurred.

As a case where the absolute value of the differentiated value is equal to or greater than the threshold value, cases where the defect such as a crack appears or exists at the insulator then the so-called through-discharge occurs between the center electrode and the metal shell through the insulator and where a surface discharge (a creeping discharge) (the flash-over) that discharges between the center electrode and the ground electrode not through the insulator occurs could arise. In the following description, these discharges are also simply called "discharge". Since there is a difference in emission or radiation upon discharge between both these cases, it is conceivable that both these cases will be distinguished by the image of the of the top end side of the assembly. However, in a case of this distinguishing manner, a judgment as to whether or not the noise is generated is not possible.

Therefore, in the inspection process, in the case where the differentiated value change state occurs, the device does not immediately judge that the discharge has occurred, but previously judges whether or not the occurrence of the differentiated value change state is caused by the noise. Then, when judged that the occurrence of the differentiated value change state is not caused by the noise, the device judges that the discharge has occurred. That is, when the differentiated value change state occurs, after excluding the case where the occurrence of the differentiated value change state is caused by the noise, according to the image obtained by the image-capture step, the judgment is made as to whether or not the defect exists at the insulator of the assembly where the differentiated value change state has occurred. Hence, it is possible to increase accuracy of the judgment as to whether or not the defect exists at the insulator.

In the noise judgment step, if the absolute value of the voltage applied to the center electrode where the differentiated value change state has occurred is equal to or greater than a predetermined value for the specific time from the occurrence of the differentiated value change state, the occurrence of the differentiated value change state could be judged to be caused by the noise.

In the case where the absolute value of the applied voltage is maintained at the predetermined value or greater for the specific time from the occurrence of the differentiated value change state, there is a strong possibility that the differentiated value change state has occurred due to the noise. Therefore, by judging that when the absolute value of the applied voltage is equal to or greater than the predetermined value for the specific time from the occurrence of the differentiated value change state, the occurrence of the differentiated value change state is caused by the noise, a judgment of the noise can be accurately made.

According to another aspect of the present invention, a method of manufacturing a spark plug having an insulator having an axial hole that extends along an axis, a center electrode accommodated in the axial hole of the insulator with a part of the center electrode being exposed from a top end side of the insulator, a metal shell provided on an outer periphery of the insulator so as to cover a periphery of at least a part of the insulator and a ground electrode connected to a top end side of the metal shell and facing the center electrode, the method comprises: the inspection process of the above inspection method of the spark plug.

According to the manufacturing method of the spark plug, in the same manner as the above inspection method, by judging whether or not the differentiated value change state in which the absolute value of the differentiated value becomes equal to or greater than the predetermined threshold value occurs, the judgment as to whether or not the discharge (the through-discharge) has occurred can be made. And, according to the voltage applied, for the specific time (the predetermined time) from the occurrence of the differentiated value change state, to the center electrode where the differentiated value change state has occurred, the judgment is made as to whether or not the occurrence of the differentiated value change state is caused by the noise. With this judgment, it is possible to judge whether the occurrence of the differentiated value change state is caused by the noise or by the discharge. Hence, accuracy of the inspection when concurrently conducting the inspections of the plurality of insulators can be increased.

According to the present invention, it is possible to increase accuracy of the inspection when concurrently conducting the inspections of the plurality of insulators.

The other objects and features of this invention will become understood from the following description with reference to the accompanying drawings.

DETAILED DESCRIPTION

Embodiments of the present invention will be explained below with reference to the drawings.

1. First Embodiment

1-1. Configuration of Assembly 1

Figure 1:
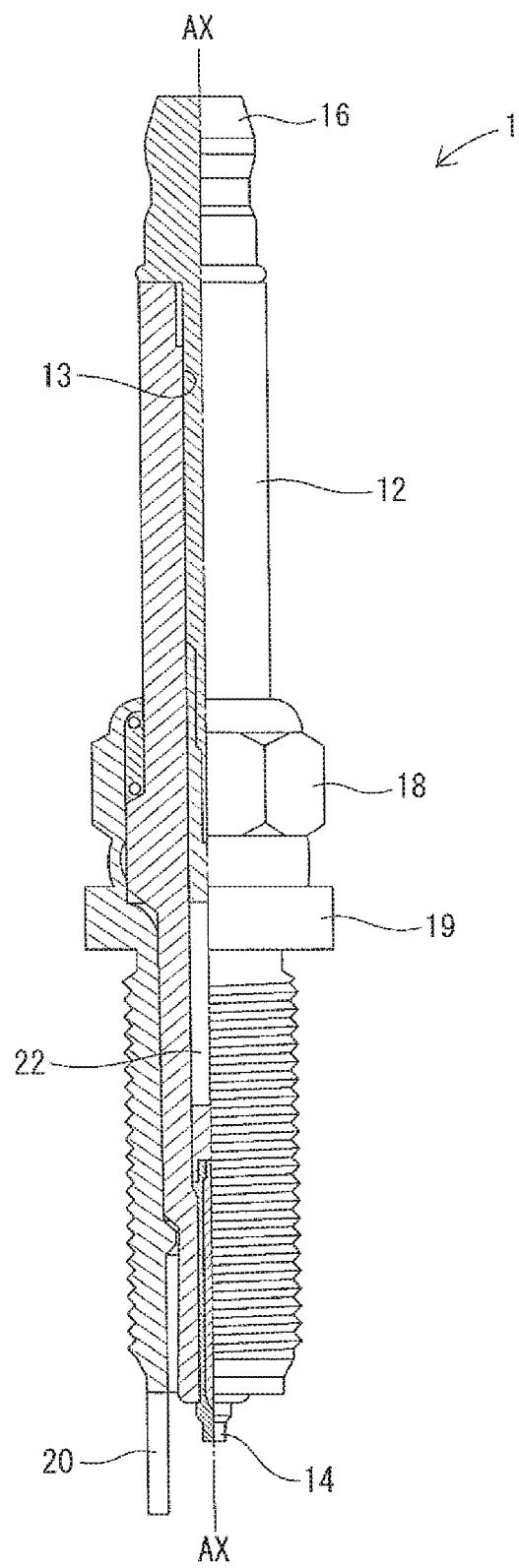
FIG. 1 is a drawing of an assembly with a left side of the assembly being shown by a vertically-cut cross section.

An assembly 1 shown in FIG. 1 is an uncompleted spark plug, which is a member before a ground electrode 20 is bent. This assembly 1 is an object for inspection carried out by an after-mentioned spark plug manufacturing device 100 in an inspection process. The assembly 1 has a narrow columned shape that extends along an axis AX shown by a dashed line in FIG. 1. FIG. 1 shows, at a right side with respect to the axis AX, an external side view of the assembly 1, and shows, at a left side, a sectional view, cut by a plane passing through the axis AX, of the assembly 1. In the following description, a lower side of FIG. 1 is called a front end side (or a top end side) of the assembly 1 (the spark plug), and an upper side of FIG. 1 is called a base end side of the assembly 1 (the spark plug).

The assembly 1 mainly has an insulator 12, a center electrode 14, a metal terminal 16, a metal shell 18, a ground electrode 20 and a resistor 22.

The insulator 12 is formed into a tubular shape, and has an axial hole 13 that extends along the axis AX. The insulator 12 is located between the center electrode 14, the metal terminal 16 and the metal shell 18. The insulator 12 insulates the center electrode 14 and the metal terminal 16 from the metal shell 18.

The center electrode 14 is a rod-shaped electrode that extends along the axis AX direction. The center electrode 14 is accommodated in the axial hole 13 of the insulator 12 with a part of the center electrode 14 being exposed from a top end side of the insulator 12.

The metal terminal 16 is a terminal for receiving power. The metal terminal 16 has a rod-shape. The metal terminal 16 is accommodated in the axial hole 13 of the insulator 12 with a part of metal terminal 16 being exposed from a base end portion of the insulator 12. The resistor 22 (e.g. a ceramic resistor) is placed between the metal terminal 16 and the center electrode 14 in the axial hole 13, and the metal terminal 16 and the center electrode 14 are electrically connected to each other through the resistor 22.

The metal shell 18 is a tubular metal member. The metal shell 18 is provided on an outer periphery of the insulator 12 so as to cover a periphery of at least a part of the insulator 12. The metal shell 18 has a disc-shaped brim portion 19 that protrudes in a radially outward direction of the axis AX. The center electrode 14 and the ground electrode 20 are located at a top end side with respect to the brim portion 19.

The ground electrode 20 is an electrode connected to a top end side of the metal shell 18. The ground electrode 20 has a shape that extends in one direction (in a direction parallel to the axis AX), and a top end of the ground electrode 20 extends and is located at a top end side with respect to a top end of the insulator 12. Although the ground electrode 20 has the shape extending in one direction in FIG. 1, the ground electrode 20 is finally bent so as to form a spark discharge gap between the ground electrode 20 and the center electrode 14.

1-2. Configuration of Spark Plug Manufacturing Device 100

Figure 2:
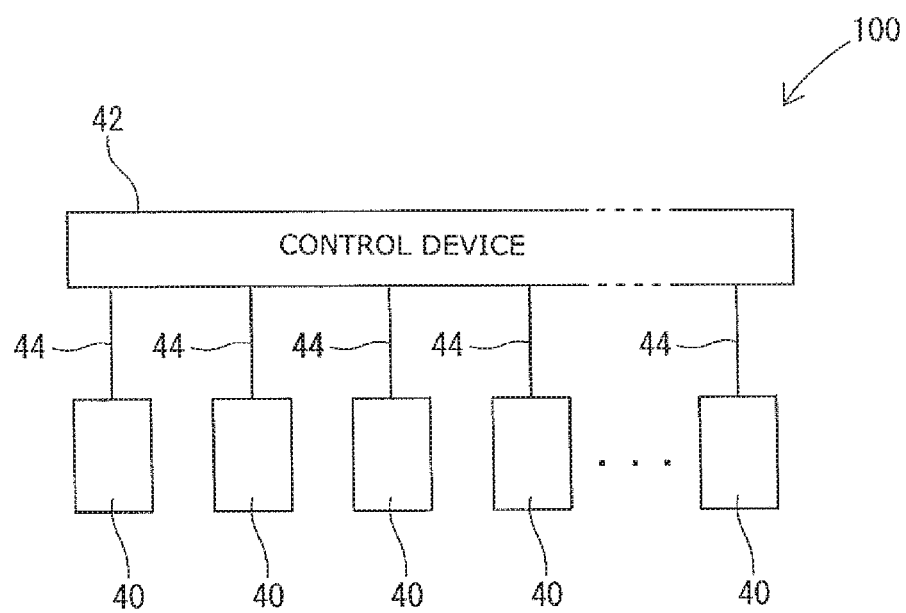
FIG. 2 is an explanatory drawing showing a configuration of a spark plug manufacturing device.

The spark plug manufacturing device 100 (hereinafter, also simply called manufacturing device 100) is a device that manufactures the spark plug. The manufacturing device 100 is used to carry out the inspection process where the inspection of the assembly 1 is conducted. As shown in FIG. 2, the manufacturing device 100 has a plurality of inspection units 40 and a control device 42. Each inspection unit 40 is a device to inspect the assembly 1, more specifically, a device to inspect a defect of the insulator 12 of the assembly 1. Each inspection unit 40 can inspect one assembly 1. That is, the manufacturing device 100 having the plurality of inspection units 40 can concurrently inspect a plurality of assemblies 1. The plurality of inspection units 40 are grounded through a common ground line (not shown).

The control device 42 is configured by e.g. a microcontroller, an arithmetic unit such as CPU and a memory such as ROM and RAM. The control device 42 is electrically connected to the inspection units 40 individually through respective first wirings 44, and can control the inspection units 40 individually.

Figure 3:
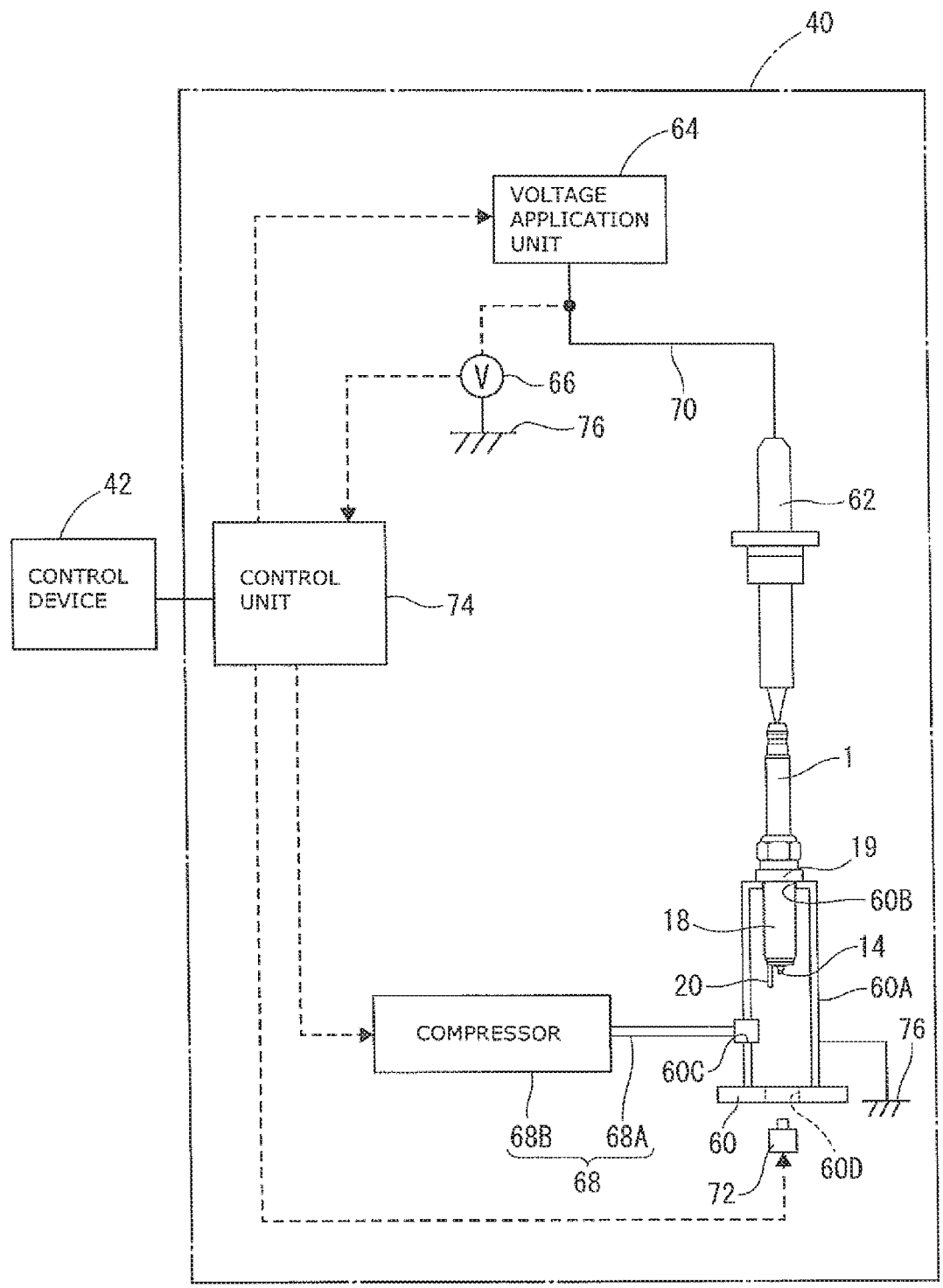
FIG. 3 is an explanatory drawing showing a configuration of an inspection unit that is formed as a part of the spark plug manufacturing device.

Each inspection unit 40 has a same configuration. Therefore, in the following description, a configuration of one inspection unit 40 will be explained. As shown in FIG. 3, the inspection unit 40 has a holder 60, a metal electric energizer 62, a voltage application unit 64, a voltage sensor 66, a pressure control unit 68, a second wiring 70, an imaging device (or a shooting device) 72 and a control unit 74.

The holder 60 is a member that holds the assembly that is an object for inspection, and is formed by a conductive member (e.g. steel such as stainless steel). The holder 60 is electrically connected to a ground part 76. The holder 60 has a tubular container 60A extending an up-and-down direction (a vertical direction). The container 60A has on an upper surface thereof a circular opening 60B. The opening 60B is formed such that a diameter of the opening 60B is smaller than a diameter of the brim portion 19 of the assembly 1 and greater than a diameter, at a top end side of the brim portion 19, of the assembly 1. The assembly 1 is inserted into the container 60A from its top end side through the opening 60B in a preparation step (described later), and a movement in an insertion direction of the assembly 1 is limited by a top end surface of the brim portion 19 being in contact with an upper surface of the container 60A. A position at which the movement in an insertion direction of the assembly 1 is limited is hereinafter called a preparation position. The ground electrode 20 of the assembly 1 placed at the preparation position is electrically connected to the ground part 76 through the holder 60.

The metal electric energizer 62 is a rod-shaped member having conductivity. A top end of the metal electric energizer 62 contacts the metal terminal 16, and a base end of the metal electric energizer 62 is electrically connected to the voltage application unit 64 through the second wiring 70. The metal electric energizer 62 is configured to be able to conduct a voltage applied by the voltage application unit 64 to the assembly 1. As the metal electric energizer 62, a spark plug could be used.

The voltage application unit 64 is configured by e.g. a primary coil, a secondary coil, a core, an igniter and a battery, in the same manner as a voltage application unit 500 disclosed in JP2016-173958. The voltage application unit 64 is electrically connected to the control unit 74. The voltage application unit 64 is configured to be able to apply a predetermined voltage to the assembly 1 through the second wiring 70 and the metal electric energizer 62 according to a control signal outputted from the control unit 74. For instance, in the inspection process (described later), as the predetermined voltage, a high voltage, which is a predetermined electric potential difference with respect to an electric potential of the ground electrode 20 (an electric potential of the ground part 76), can be applied to the assembly 1.

The voltage sensor 66 is electrically connected to the second wiring 70. The voltage sensor 66 is configured to be able to continuously detect a voltage applied to the second wiring 70. The voltage sensor 66 is electrically connected to the ground part 76. The voltage sensor 66 is configured to be able to detect an electric potential difference (i.e. a voltage) of the second wiring 70 with respect to the electric potential of the ground part 76 (the ground electrode 20) Further, the voltage sensor 66 is electrically connected to the control unit 74. The voltage sensor 66 is configured to be able to output a signal indicating a detected voltage value to the control unit 74.

The pressure control unit 68 is connected to the container 60A. The pressure control unit 68 is configured to be able to increase an internal pressure of the container 60A by providing compressed air into the container 60A. More specifically, the pressure control unit 68 has a piping 68A and a compressor 68B. The piping 68A communicates with an inside of the container 60A through an air supply and exhaust opening 60C that is formed on a side surface of the container 60A. The piping 68A is provided with a check valve (not shown) in the piping 68A. The compressor 68B is connected to the piping 68A. The compressor 68B is configured to be able to provide air compressed by the compressor 68B into the container 60A through the piping 68A. The pressure control unit 68 (the compressor 68B) is electrically connected to the control unit 74, and provides the air compressed by the compressor 68B into the container 60A according to a control signal outputted from the control unit 74.

The imaging device 72 is a device, such as a CCD camera, which captures an image of a top end side of the assembly 1. The imaging device 72 is arranged so as to face the top end side of the assembly 1 set at the holder 60. The holder 60 is provided with a window 60D between the assembly 1 and the imaging device 72, thereby visually identifying the inside of the holder 60 through the window 60D. The imaging device 72 can capture the image of the assembly 1 from a front side (the top end side) of the assembly 1 through the window 60D. The imaging device 72 is electrically connected to the control unit 74. The imaging device 72 is configured to be able to capture the image of the top end side of the assembly 1 according to a control signal outputted from the control unit 74, and output an image data corresponding to the captured image to the control unit 74.

The control unit 74 is configured by e.g. a micro-controller, an arithmetic unit such as CPU and a memory such as ROM and RAM. The control unit 74 is configured to be able to judge the presence or absence of the defect of the insulator 12 of the assembly 1 according to information obtained from the voltage sensor 66 and the imaging device 72. The control unit 74 is electrically connected to the control device 42, and can send and receive data to and from the control device 42.

1-3. Manufacturing Method of Spark Plug

In a manufacturing process of the spark plug, first, the center electrode 14 and the metal terminal 16 are inserted into the axial hole 13 of the insulator 12, and these center electrode 14 and metal terminal 16 are fixed to the insulator 12. Here, the resistor 22 is provided between the center electrode 14 and the metal terminal 16 in the axial hole 13. The ground electrode 20 is connected to the top end side of the metal shell 18. Further, the metal shell 18 is secured to the insulator 12 to which the center electrode 14 and the metal terminal 16 are fixed, then the assembly 1 is obtained.

The assembly 1 obtained as described above undergoes an inspection of withstand voltage. If a defect such as a crack exists at the insulator 12 of the assembly 1, when applying a voltage to the center electrode 14, there is a risk that a through-discharge will occur from the center electrode 14 to the metal shell 18 through the defect (e.g. the crack) of the insulator 12. Then, if such through-discharge occurs, there is a risk that a normal discharge will not occur between the center electrode 14 and the ground electrode 20 and ignition will be disabled. Because of this, the inspection of the defect (a withstand voltage test) of the insulator 12 is necessary. In the following description, the inspection process where the defect of the insulator 12 is inspected will be explained.

In the inspection process, the preparation step, a voltage application step, a detection step, an image-capture step, a differentiation step, a differentiated value judgment step, a noise judgment step and a defect judgment step are carried out. Here, the control unit 74 of each inspection unit 40 could perform each of the steps by receiving a command for each step from the control device 42, or may perform each step in sequence by receiving a start command from the control device 42.

Figure 4:
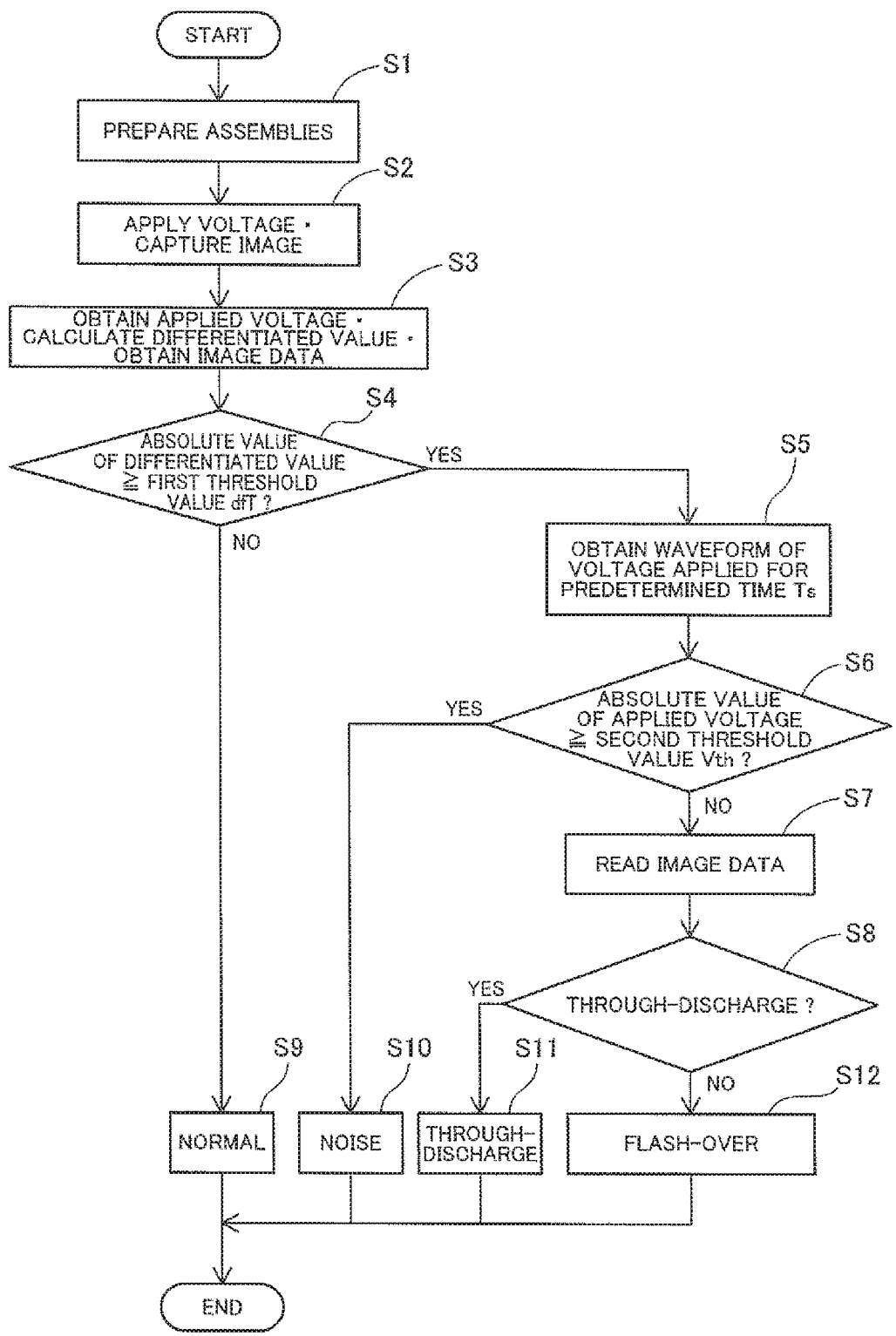
FIG. 4 is a flow chart showing an example of an inspection process.

As shown in FIG. 4, in the inspection process, first, at step S1, the preparation step is carried out. In this preparation step, the plurality of assemblies 1 are prepared. That is, the assembly 1 is set in each inspection unit 40. More specifically, each assembly 1 is inserted in the opening 60B of the container 60A of each inspection unit 40 and placed at the preparation position, then secured to the holder 60 by a lock mechanism (not shown). With this setting, the inside of the container 60A becomes a hermetically enclosed space. In a state in which the assembly 1 is set at the preparation position, the center electrode 14, a top end portion of the metal shell 18 and the ground electrode 20 of the assembly 1 are located inside the container 60A. After the assembly 1 is set at the preparation position, the control unit 74 of each inspection unit 40 provides the compressed air into the container 60A and increases a pressure in the container 60A to a predetermined pressure by controlling the pressure control unit 68.

After completing the preparation step, at step S2, the voltage application step, the detection step and the image-capture step are carried out.

In the voltage application step, the manufacturing device 100 applies the predetermined voltage to the center electrode 14 of each of the plurality of assemblies 1 prepared in the preparation step. More specifically, the control unit 74 of each inspection unit 40 applies the predetermined voltage to the center electrode 14 of the assembly 1 prepared in the preparation step by controlling the voltage application unit 64. It is noted that a voltage application timing could be the same among the inspection units 40, or may not be the same among the inspection units 40.

In the detection step, the manufacturing device 100 detects the voltage applied to each of the plurality of center electrodes 14 during a time period during which the voltage application step is carried out by the voltage sensors corresponding to the respective center electrodes 14. More specifically, the voltage sensor 66 of each inspection unit 40 detects the voltage applied to the center electrode 14 during the time period during which the voltage application step is carried out, and outputs the signal indicating the detected voltage value to the control unit 74.

In the image-capture step, the manufacturing device 100 captures the image of the top end side of each of the plurality of assemblies 1 by the imaging devices 72 during the voltage application step. More specifically, the control unit 74 of each inspection unit 40 captures the image of the assembly 1 during the voltage application step by controlling the imaging device 72. The imaging device 72 captures the image of the assembly 1 with the same timing as the voltage application by the voltage application unit 64. With this, it is possible for the imaging device 72 to capture an image of a state or a spot of the discharge when the discharge occurs.

The imaging device 72 outputs the image data corresponding to the captured image to the control unit 74.

This image-capture step is carried out for the following purpose. When the inspection unit 40 applies the predetermined voltage to the center electrode 14, there are two cases; one is a case where a discharge occurs between the center electrode 14 and the ground electrode 20 or between the center electrode 14 and metal shell 18, and the other is a case where the discharge does not occur. In the case where the discharge does not occur, this means that there is no occurrence of the through-discharge. Therefore, in this case, it is possible to judge that no defect such as the crack exists at the insulator 12. Further, even in the case where the discharge occurs, this might be a flash-over that discharges between the center electrode 14 and the ground electrode 20 at a top end side of the insulator 12 not through the insulator 12. If the discharge is this flash-over, it is possible to judge that no defect such as the crack exists at the insulator 12. In order to discriminate between these through-discharge and flash-over, the image-capture step to capture the image of the assembly 1 upon occurrence of the discharge is carried out. Discrimination between the through-discharge and the flash-over is carried out in the defect judgment step (described later).

After completing step S2 (the voltage application step, the detection step and the image-capture step), at step S3, obtaining of the applied voltage, calculation of a differentiated value (the differentiation step) and obtaining of the image data, etc. are carried out.

In the differentiation step, the manufacturing device 100 calculates the differentiated value by differentiating the applied voltage, detected by each of the plurality of voltage sensors 66 during the detection step, with respect to time. More specifically, the control unit 74 of each inspection unit 40 obtains the applied voltage detected by the voltage sensor 66 during the detection step, and calculates the differentiated value by differentiating the applied voltage obtained with respect to time. Further, the control unit 74 of each inspection unit 40 obtains the image data from the imaging device 72.

After completing step S3, at step S4, the differentiated value judgment step is carried out. In the differentiated value judgment step, the manufacturing device 100 judges whether or not a differentiated value change state in which an absolute value of any one differentiated value calculated in the differentiation step becomes equal to or greater than a predetermined first threshold value dfT occurs. More specifically, the control unit 74 of each inspection unit 40 judges whether or not the differentiated value change state in which the absolute value of the differentiated value calculated in the differentiation step becomes equal to or greater than the predetermined first threshold value dfT occurs.

Figure 5A:
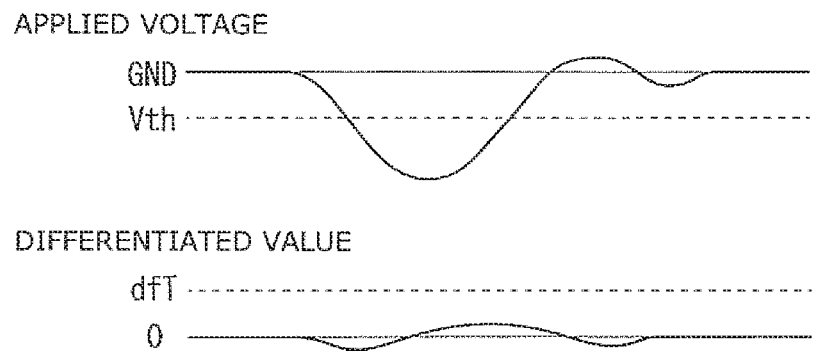
FIG. 5A is a drawing showing, as an example, a relationship between an applied voltage and a differentiated value obtained by differentiating the applied voltage with respect to time, when an insulator is normal.
Figure 5B:
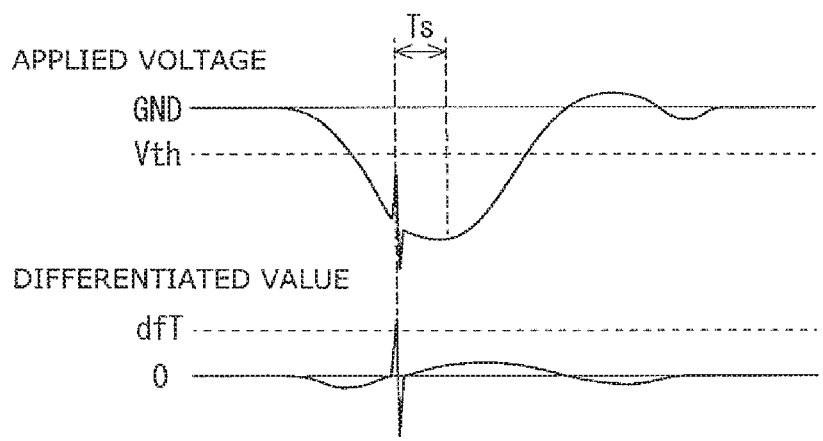
FIG. 5B is a drawing showing, as an example, a relationship between an applied voltage and a differentiated value obtained by differentiating the applied voltage with respect to time, when a noise is generated.
Figure 5C:
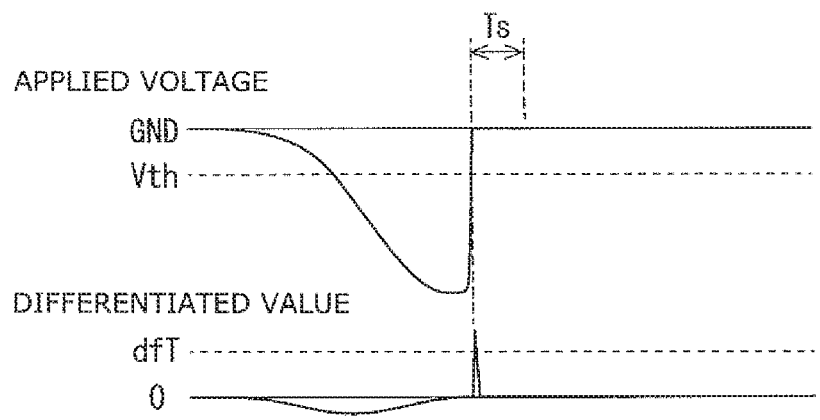
FIG. 5C is a drawing showing, as an example, a relationship between an applied voltage and a differentiated value obtained by differentiating the applied voltage with respect to time, when a defect exists at the insulator.

As mentioned above, when applying the voltage to the assembly 1, the cases where the discharge does not occur and where the discharge occurs arise. In the case where the discharge does not occur, as shown in FIG. 5A, the applied voltage changes smoothly or gently. In contrast to this, in the case where the discharge occurs, as shown in FIG. 5C, the applied voltage rapidly changes up to a ground level (a voltage of the ground electrode 20) at a time when the discharge occurs. Because of this, the absolute value of the differentiated value becomes large. Therefore, the control unit 74 is configured to judge that when the absolute value of the differentiated value is less than the first threshold value dfT, the discharge does not occur, whereas when the absolute value of the differentiated value is equal to or greater than the first threshold value dfT, the discharge occurs.

When the differentiated value change state does not occur (No at step S4), the control unit 74 judges that the assembly 1 (the insulator 12) is normal (i.e. there is no defect) at step S9. On the other hand, when the differentiated value change state occurs (Yes at step S4), the control unit 74 performs the noise judgment step at steps S5, S6 and S10.

The noise judgment step is carried out for the following purpose. As an example, the plurality of inspection units 40 are grounded through the common ground line. Because of this, when concurrently conducting the inspections by the plurality of inspection units 40, there is a case where a voltage applied by one inspection unit 40 is conducted to another inspection unit 40 through the ground part 76 and appears as a noise at another inspection unit 40. If the noise is generated, the voltage of the second wiring 70 rapidly changes, then the differentiated value could become large.

In this case, there is a risk that an occurrence of the differentiated value change state will be judged even though the discharge has not actually occurred. Thus, this needs distinguishing from the case of the discharge. Accordingly, in order to judge whether or not the occurrence of the differentiated value change state is caused by the noise, the noise judgment step is carried out.

As shown in FIG. 5C, the applied voltage of the case where the discharge occurs rapidly changes toward the ground level (the voltage of the ground electrode 20) upon occurrence of the differentiated value change state, and remains at this ground level (the voltage of the ground electrode 20). In contrast to this, as shown in FIG. 5B, the applied voltage of the case where the noise is generated rapidly changes upon occurrence of the differentiated value change state, but immediately after that, returns to a voltage that is substantially same as or close to the voltage before the differentiated value change state occurs.

Therefore, in the noise judgment step, the manufacturing device 100 judges, according to the voltage applied, for a predetermined time Ts from the occurrence of the differentiated value change state, to the center electrode 14 where the differentiated value change state has occurred, whether or not the occurrence of the differentiated value change state is caused by the noise. More specifically, if an absolute value of the voltage applied to the center electrode 14 where the differentiated value change state has occurred is equal to or greater than a second threshold value Vth for (or throughout) the predetermined time Ts from the occurrence of the differentiated value change state (Yes at step S6), the manufacturing device 100 judges that the occurrence of the differentiated value change state is caused by the noise (at step S10).

That is, the control unit 74 of the inspection unit 40, which has detected the occurrence of the differentiated value change state, obtains a waveform of the voltage applied to the center electrode 14 for the predetermined time Ts from the occurrence of the differentiated value change state (at step S5). Then, the control unit 74 judges, according to the applied voltage waveform obtained, whether or not the occurrence of the differentiated value change state is caused by the noise (at steps S6 and S10). More specifically, if the absolute value of the voltage applied to the center electrode 14 is equal to or greater than the second threshold value Vth for the predetermined time Ts from the occurrence of the differentiated value change state (Yes at step S6), the control unit 74 judges that the occurrence of the differentiated value change state is caused by the noise (at step S10).

If the absolute value of the voltage applied to the center electrode 14 is less than the predetermined second threshold value Vth for the predetermined time Ts from the occurrence of the differentiated value change state (No at step S6), the defect judgment step is carried out at steps S7, S8, S11 and S12.

In the defect judgment step, the manufacturing device 100 judges, according to the image obtained by the image-capture step, whether or not the defect exists at the insulator 12 of the assembly 1 where the differentiated value change state has occurred (at step S7 and S8). More specifically, the control unit 74 of the inspection unit 40, which has judged that the occurrence of the differentiated value change state is not caused by the noise in the noise judgment step, reads the image data obtained from the imaging device 72 (at step S7), and judges whether or not the discharge is the through-discharge (at step S8).

As a method of judging whether or not the discharge is the through-discharge, a known-method could be employed. For instance, the following method, as disclosed in JP2017-027726, could be employed. The image obtained is binarized (the image obtained is converted into binary images), and barycentric coordinates of a higher brightness part of the binary images are calculated, then the judgment as to whether or not the discharge is the through-discharge is made on the basis of the calculated barycentric coordinates.

When the control unit 74 judges that the discharge is the through-discharge (Yes at step S8), the control unit 74 judges that the through-discharge has occurred (at step S11). In contrast, when the control unit 74 judges that the discharge is not the through-discharge (No at step S8), the control unit 74 judges that the flash-over has occurred (at step S12). When any one of the steps S9 to S12 is ended, the inspection process is ended.

When judged in the inspection process that the through-discharge has occurred, the insulator 12 of the assembly 1 is judged to have the defect. On the other hand, when judged in the inspection process that the through-discharge has not occurred (when judged that the assembly 1 (the insulator 12) is normal, when judged that the occurrence of the differentiated value change state is caused by the noise, and when judged that the discharge is the flash-over), the insulator 12 of the assembly 1 is judged to have no defect. Then, the ground electrode 20 of this assembly 1 is bent so as to form the spark discharge gap between the ground electrode and the center electrode 14, and the spark plug is completed.

1-4. Effects

According to the inspection method of the spark plug, after preparing the plurality of assemblies 1, the manufacturing device 100 applies the predetermined voltage to the center electrode 14 of each of the plurality of assemblies 1. The manufacturing device 100 detects the voltage applied to each of the plurality of center electrodes 14 by the respective voltage sensors 66, and calculates the differentiated value by differentiating the applied voltage, detected by each of the voltage sensors 66, with respect to time. In the case where the discharge does not occur at the assembly 1, since the applied voltage changes smoothly or gently, the absolute value of the differentiated value is small. However, in the case where the discharge has occurred at the assembly 1, since the voltage value (the applied voltage) rapidly changes, the absolute value of the differentiated value becomes large. Therefore, by judging whether or not the differentiated value change state in which the absolute value of the differentiated value becomes equal to or greater than the predetermined threshold value occurs, the judgment as to whether or not the through-discharge has occurred can be made.

This differentiated value change state could occur not only when the through-discharge occurs, but also when the noise is generated. Here, when the through-discharge has occurred, the applied voltage just after the occurrence of the through-discharge is substantially maintained at the ground level (the voltage of the ground electrode 20), whereas when the noise is generated, the applied voltage just after the occurrence of the through-discharge returns to the voltage that is substantially same as or close to the voltage before the noise is generated. In the present invention, the inventor focused attention on this phenomenon, and according to the voltage applied, for a specific time (the predetermined time) from the occurrence of the differentiated value change state, to the center electrode 14 where the differentiated value change state has occurred, the judgment is made as to whether or not the occurrence of the differentiated value change state is caused by the noise. With this judgment, it is possible to judge whether the occurrence of the differentiated value change state is caused by the noise or by the discharge. Hence, accuracy of the inspection when concurrently conducting the inspections of the plurality of insulators 12 can be increased.

Further, in the inspection process, the image of the top end side of each of the plurality of assemblies 1 is captured by the imaging devices 72 during the voltage application step. Also, in the inspection process, when judged that the occurrence of the differentiated value change state is not caused by the noise in the noise judgment step, according to the image obtained by the image-capture step, the judgment is made as to whether or not the defect exists at the insulator 12 of the assembly 1 where the differentiated value change state has occurred.

As a case where the absolute value of the differentiated value is equal to or greater than the threshold value, the cases where the defect such as the crack appears or exists at the insulator 12 then the through-discharge occurs between the center electrode 14 and the metal shell 18 through the insulator 12 and where a surface discharge (a creeping discharge) (the flash-over) that discharges between the center electrode 14 and the ground electrode 20 not through the insulator 12 occurs could arise. Since there is a difference in emission or radiation upon discharge between both these cases, it is conceivable that both these cases will be distinguished by the image of the of the top end side of the assembly 1. However, in a case of this distinguishing manner, a judgment as to whether or not the noise is generated is not possible.

Therefore, in the inspection process, in the case where the differentiated value change state occurs, the device does not immediately judge that the discharge has occurred, but previously judges whether or not the occurrence of the differentiated value change state is caused by the noise. Then, when judged that the occurrence of the differentiated value change state is not caused by the noise, the device judges that the discharge has occurred. That is, when the differentiated value change state occurs, after excluding the case where the occurrence of the differentiated value change state is caused by the noise, according to the image obtained by the image-capture step, the judgment is made as to whether or not the defect exists at the insulator 12 of the assembly 1 where the differentiated value change state has occurred. Hence, it is possible to increase accuracy of the judgment as to whether or not the defect exists at the insulator 12.

Moreover, in the noise judgment step, if the absolute value of the voltage applied to the center electrode 14 where the differentiated value change state has occurred is equal to or greater than the predetermined value for (or throughout) the specific time from the occurrence of the differentiated value change state, the occurrence of the differentiated value change state could be judged to be caused by the noise.

In the case where the absolute value of the applied voltage is maintained at the predetermined value or greater for the specific time from the occurrence of the differentiated value change state, there is a strong possibility that the differentiated value change state has occurred due to the noise. Therefore, by judging that when the absolute value of the applied voltage is equal to or greater than the predetermined value for the specific time from the occurrence of the differentiated value change state, the occurrence of the differentiated value change state is caused by the noise, a judgment of the noise can be accurately made.

Other Embodiment

The present invention is not limited to the above embodiment explained by the above description and drawings, but includes the following embodiments. Further, features of the above and following embodiments could be combined as long as they are not incompatible with each other.

In the first embodiment, the object for inspection is the assembly 1 of the uncompleted spark plug. However, the object for inspection could be a completed spark plug.

In the first embodiment, the image-capture step is carried out during the voltage application step. However, the capture step could be carried out during a step except the voltage application step, or might be carried out between the steps.

In the first embodiment, one assembly 1 undergoes each step of the inspection process once. However, one assembly 1 could undergo each step of the inspection process repeatedly a plurality of times, except for the preparation step.

In the first embodiment, the occurrence of the differentiated value change state is detected only once during one voltage application step. However, the occurrence of the differentiated value change state could be detected a plurality of times during the one voltage application step. In this case, when judged that any one of the plurality of detected occurrences of the differentiated value change state is caused by the occurrence of the through-discharge, the assembly 1 could be judged to have the defect.

Timings of the voltage application between the inspection units 40 could be intentionally shifted in the voltage application step. With this, an occurrence of the noise, which is caused by the voltage application by another inspection unit 40, can be suppressed.

In the first embodiment, the presence or absence of the occurrence of the differentiated value change state is judged regardless of a time period of an actual voltage application. However, the judgment of the presence or absence of the occurrence of the differentiated value change state could not be carried out for a time period for which the voltage is not applied. There is no need to detect the presence or absence of the discharge for the time period for which the voltage is not applied. In addition, there is a risk that the differentiated value change state will occur due to the noise. Therefore, by not judging the presence or absence of the occurrence of the differentiated value change state for the time period for which the voltage is not applied, it is possible to suppress a wrong judgment of the occurrence of the through-discharge.

The entire contents of Japanese Patent Applications No. 2018-147334 filed on Aug. 6, 2018 are incorporated herein by reference.

Although the invention has been described above by reference to certain embodiment of the invention, the invention is not limited to the embodiment described above. Modifications and variations of the embodiment described above will occur to those skilled in the art in light of the above teachings. The scope of the invention is defined with reference to the following claims.

The invention claimed is:

1. A method of inspecting a spark plug comprising:
an inspection process of inspecting a defect of an insulator of the spark plug, the inspection process comprising:
preparation step of preparing a plurality of assemblies, wherein each assembly has the insulator having an axial hole that extends along an axis, a center electrode accommodated in the axial hole of the insulator with a part of the center electrode being exposed from a top end side of the insulator, a metal shell provided on an outer periphery of the insulator so as to cover a periphery of at least a part of the insulator and a ground electrode connected to a top end side of the metal shell;
voltage application step of applying a predetermined voltage to the center electrode of each of the plurality of assemblies prepared in the preparation step;
detection step of detecting a voltage applied to each of the plurality of center electrodes by voltage sensors corresponding to the respective center electrodes at least during a time period during which the voltage application step is carried out;
differentiation step of calculating a differentiated value by differentiating the applied voltage, detected by each of the plurality of voltage sensors during the detection step, with respect to time;
differentiated value judgment step of judging whether or not a differentiated value change state in which an absolute value of any one differentiated value calculated in the differentiation step becomes equal to or greater than a predetermined threshold value occurs; and
noise judgment step of judging, when the differentiated value change state is judged to have occurred by the differentiated value judgment step, whether or not the occurrence of the differentiated value change state is caused by noise, according to the voltage applied, for a specific time from the occurrence of the differentiated value change state, to the center electrode where the differentiated value change state has occurred.

2. The method of inspecting the spark plug as claimed in claim 1, wherein:
the inspection process further comprising;
image-capture step of capturing an image of a top end side of each of the plurality of assemblies by respective imaging devices during the voltage application step; and
defect judgment step of judging, when judged that the occurrence of the differentiated value change state is not caused by the noise in the noise judgment step, whether or not the defect exists at the insulator of the assembly where the differentiated value change state has occurred, according to the image obtained by the image-capture step.

3. The method of inspecting the spark plug as claimed in claim 1, wherein:

in the noise judgment step, if an absolute value of the voltage applied to the center electrode where the differentiated value change state has occurred is equal to or greater than a predetermined value for the specific time from the occurrence of the differentiated value change state, the occurrence of the differentiated value change state is judged to be caused by the noise.

4. A method of manufacturing a spark plug, the spark plug having an insulator having an axial hole that extends along an axis, a center electrode accommodated in the axial hole of the insulator with a part of the center electrode being exposed from a top end side of the insulator, a metal shell provided on an outer periphery of the insulator so as to cover a periphery of at least a part of the insulator and a ground electrode connected to a top end side of the metal shell and facing the center electrode, the method comprising:

the inspection process as claimed in claim 1.

* * * * *